United States Patent
Ueda

(10) Patent No.: US 8,269,527 B2
(45) Date of Patent: Sep. 18, 2012

(54) HYSTERESIS COMPARATOR CIRCUIT AND SEMICONDUCTOR DEVICE INCORPORATING SAME

(75) Inventor: Yasuo Ueda, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 4 days.

(21) Appl. No.: 12/874,740

(22) Filed: Sep. 2, 2010

(65) Prior Publication Data

US 2011/0057686 A1    Mar. 10, 2011

(30) Foreign Application Priority Data

Sep. 8, 2009    (JP) ................. 2009-206591

(51) Int. Cl.
*H03K 5/22* (2006.01)

(52) U.S. Cl. ................. 327/65; 327/57; 327/97

(58) Field of Classification Search ............... 327/65; 330/252, 253; 3/65
See application file for complete search history.

(56) References Cited

U.S. PATENT DOCUMENTS

| | | | | |
|---|---|---|---|---|
| 5,894,234 A | * | 4/1999 | Morris | 327/65 |
| 6,278,336 B1 | * | 8/2001 | Tinsley et al. | 331/74 |
| 6,982,582 B1 | * | 1/2006 | Cheng | 327/205 |
| 7,940,036 B2 | * | 5/2011 | Kamatani | 323/312 |
| 2009/0206806 A1 | * | 8/2009 | Kamatani | 323/273 |
| 2010/0052743 A1 | * | 3/2010 | Kamizuma et al. | 327/144 |

FOREIGN PATENT DOCUMENTS

| | | |
|---|---|---|
| JP | 3593261 | 9/2004 |
| JP | 4058334 | 12/2007 |

* cited by examiner

*Primary Examiner* — Ryan Jager
(74) *Attorney, Agent, or Firm* — Cooper & Dunham LLP

(57) ABSTRACT

A hysteresis comparator circuit that compares first and second input signals to output a hysteresis output signal includes a constant current source, a first comparator, a second comparator, and an output circuit. The constant current source includes a load resistor to generate a given constant current. The first comparator is controlled by the constant current supplied from the constant current source to compare the first and second input signals to output a first comparison result. The second comparator is controlled by the constant current supplied from the constant current source to compare the first and second input signals to output a second comparison result. The output circuit has a pair of inputs thereof connected to the first and second comparators, respectively, which inverts an output thereof in response to each of the first and second comparison results to generate the hysteresis output signal.

9 Claims, 2 Drawing Sheets

HYSTERESIS COMPARATOR CIRCUIT AND SEMICONDUCTOR DEVICE INCORPORATING SAME

TECHNICAL FIELD

The present disclosure relates to a hysteresis comparator circuit and a semiconductor device incorporating the same, and more particularly, to a hysteresis comparator circuit achieving a wide range of accurate hysteresis characteristics with a simple circuit configuration, and a semiconductor device incorporating such a hysteresis comparator.

BACKGROUND ART

To control a brushless DC motor, it is necessary to control a motor drive signal according to a current position of the motor by reading positional information through a hole device. In this case, a differential signal formed of sign waves called a hole signal is received by a hysteresis comparator.

However, the hole signal is easily affected by common mode noise. Accordingly, it is desired to receive the signal by a high performance hysteresis comparator which has a fine hysteresis characteristic of around 30 mv. However, it is difficult to achieve such a high performance hysteresis comparator having the fine hysteresis characteristic of around 30 my under poor conditions, in which the operation of the comparator is affected by, for example, fluctuations in power supply voltage and imperfections in the manufacturing process.

Conventionally, a hysteresis comparator has been proposed which adjusts a hysteresis characteristic with high precision over a wide range. The conventional hysteresis comparator includes a differential pair, switches to change the voltages around the differential pair based on the output signal of the comparator, and resistors provided by connecting in series to or in parallel with the differential pair to control a hysteresis amount based on the output signal of the comparator.

In the conventional comparator described above, although voltage variations caused by fluctuation of the resistance of the differential pair may affect the hysteresis characteristic significantly, no consideration is given to eliminating the effect of such fluctuation of the resistance. Further, the resistance of the switches themselves also affects the hysteresis characteristic significantly. Accordingly, it is difficult to achieve a desired characteristic of the comparator.

Further, since the output signal is used as a control signal to change the connection of the switches, the comparator may generate an erroneous output signal when the feed-back signal is delayed significantly due to a wiring delay during feedback of the output signal.

BRIEF SUMMARY

This disclosure describes a novel hysteresis comparator circuit that compares first and second input signals to output a hysteresis output signal.

In one aspect of the disclosure, the hysteresis comparator circuit includes a constant current source, a first comparator, a second comparator, and an output circuit. The constant current source includes a load resistor to generate a given constant current. The first comparator is controlled by the constant current supplied from the constant current source to compare the first and second input signals to output a first comparison result. The first comparator includes a first differential pair and a first differential resistor. The first differential pair receives the first input signal at a positive input terminal thereof and the second input signal at a negative input terminal thereof. The first differential resistor is provided at one of the first differential pair to exhibit a resistance maintained at a fixed ratio to a resistance of the load resistor. The second comparator is controlled by the constant current supplied from the constant current source to compare the first and second input signals to output a second comparison result. The second comparator includes a second differential pair to receive the first input signal at a negative input terminal thereof and the second input signal at a positive input terminal thereof. The second differential resistor is provided at one of the differential pair to exhibit a resistance maintained at a fixed ratio to a resistance of the load resistor. The output circuit has a pair of inputs thereof connected to the first and second comparators, respectively, which inverts an output thereof in response to each of the first and second comparison results to generate the hysteresis output signal.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
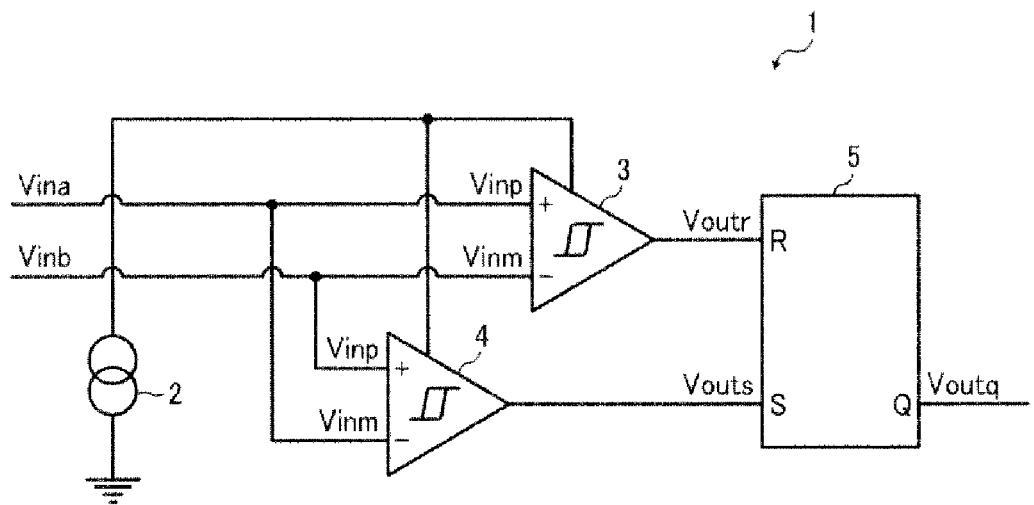
FIG. 1 is a circuit diagram of a hysteresis comparator circuit according to an illustrative first embodiment of this patent specification.

In describing preferred embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, particularly to FIG. 1, a hysteresis comparator according to an illustrative embodiment is described.

FIG. 1 is a circuit diagram of a hysteresis comparator circuit 1 according to an illustrative first embodiment.

As shown in FIG. 1, the hysteresis comparator circuit 1 includes a constant current source 2, a first comparator 3, a second comparator 4, and an output or RS latch circuit 5, which together form a hysteresis circuit to compare first and second input signals Vina and Vinb to output a hysteresis output signal Vout.

In the hysteresis comparator circuit 1, the constant current source 2 generates a constant current for supply to the first and second comparators 3 and 4.

The first comparator 3 has a positive, non-inverting input terminal Vinp connected to the first input signal Vina, and a negative, inverting input terminal Vinm connected to the second input signal Vinb, as well as an output terminal Voutr connected to a reset (R-) input of the RS latch circuit 5.

The second comparator 4 has a negative, inverting input terminal Vinm connected to the first input signal Vina, and a positive, non-inverting input terminal Vinp connected to the second input signal Vinb, as well as an output terminal Vouts connected to a set (S-) input of the RS latch circuit 5.

The RS latch circuit 5 has a Q-output which comprises a hysteresis output terminal of the comparator circuit 1.

Figure 2:
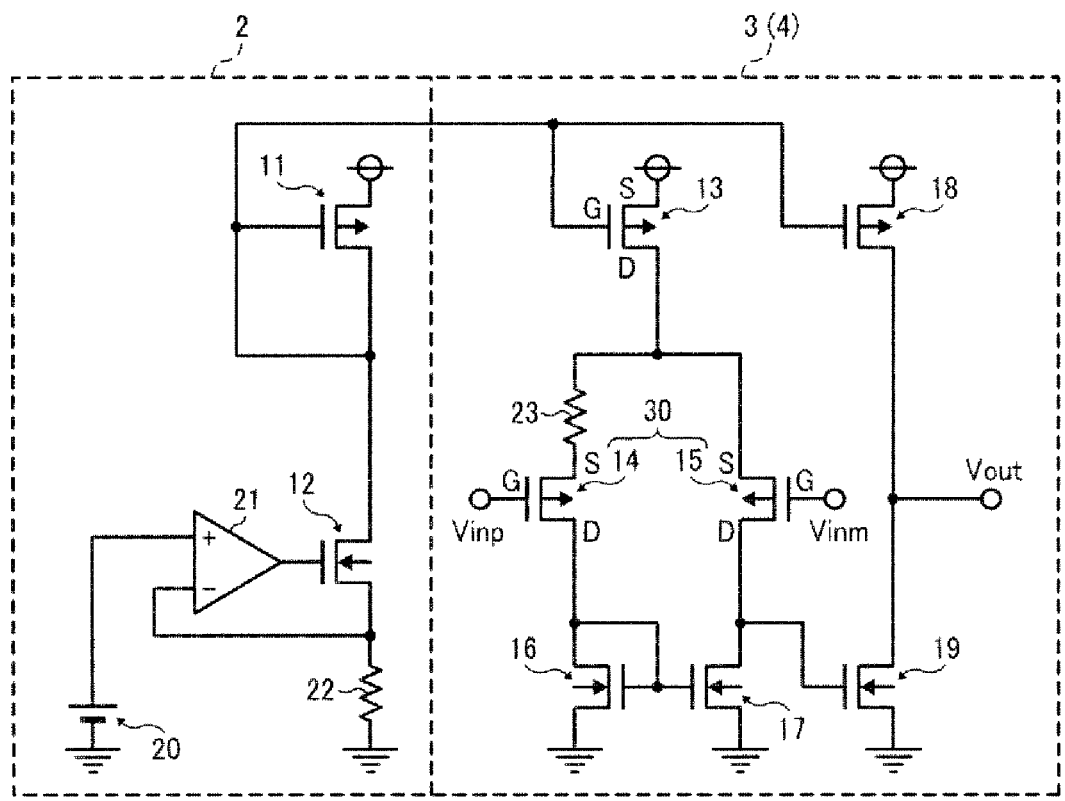
FIG. 2 is a circuit diagram schematically illustrating in detail a constant current source and a comparator included in the hysteresis comparator circuit of FIG. 1.

FIG. 2 is a circuit diagram schematically illustrating in detail the constant current source 2 and the comparator 3 in the comparator of FIG. 1.

As shown in FIG. 2, the constant current source 2 includes a p-channel metal-oxide semiconductor (PMOS) transistor 11, an n-channel metal-oxide semiconductor (NMOS) transistor 12, a power source 20, an amplifier 21, and a load resistor 22.

A source of the PMOS transistor 11 is connected to a power supply, and a drain and a gate are connected together to a drain of the NMOS transistor 12. The source of the NMOS transistor 12 is connected to one terminal of the resistor 22 and an inverting input terminal of the amplifier 21. A gate of the NMOS transistor 12 is connected to an output terminal of the amplifier 21.

One end of the resistor 22 is connected to a source of the NMOS transistor 12 and the inverting input terminal of the amplifier 21, and another end of the resistor 22 is connected to ground. The power supply 20 supplies a reference voltage in the constant current source 2. The power supply 20 is connected to a non-inverting input terminal of the amplifier 21. As noted above, the output terminal of the amplifier 21 is connected to the gate of the NMOS transistor 12.

The first comparator 3 includes PMOS transistors 13, 14, 15, and 18 and NMOS transistors 16, 17, and 19, and a differential resistor 23. The resistor 23 exhibits a resistance maintained at a fixed constant ratio to that of the load resistor 22 of the constant current source 2.

As for the PMOS transistor 13, a source is connected to the power supply, a drain is connected to one end of the resistor 23 and a source of the PMOS transistor 15, and a gate is connected to a drain and a gate of the PMOS transistor 11. Further, a gate of the PMOS transistor 13 is connected to the drain of the NMOS transistor 12.

As for the PMOS transistor 14, a source is connected to another end of the resistor 23, and a drain is connected to a drain and a gate of the NMOS transistor 16 and a gate of the NMOS transistor 17. A gate of the PMOS transistor 14 is connected to the non-inverting input terminal Vinp of the comparator 3.

As for the PMOS transistor 15, a source is connected to the one end of the resistor 23 and a drain of the PMOS transistor 13, and a drain the PMOS transistor 15 is connected to a drain of the NMOS transistor 17 and a gate of the NMOS transistor 19. A gate of the PMOS transistor 15 is connected to the inverting input terminal Vinm of the comparator 3.

The PMOS transistors 14 and 15 together form a differential pair 30, wherein the PMOS transistor 14 comprises one half of the differential pair 30 and the PMOS transistor 15 comprises the other half of the differential pair 30.

As for the PMOS transistor 18, a source is connected to the power supply, a drain of the PMOS transistor 18 is connected to an output terminal Vout and a drain of the NMOS transistor 19, and a gate of the PMOS transistor 18 is connected to the drain and the gate of the PMOS transistor 11 and the drain of the NMOS transistor 12.

As for the NMOS transistor 16, a drain and a gate are connected to a drain of the PMOS transistor 14 and a gate of the NMOS transistor 17, and a source is connected to ground.

As for the NMOS transistor 17, a drain is connected to a drain of the PMOS transistor 15 and a gate of the NMOS transistor 19, and a source is connected to ground, and a gate is connected to a drain of the PMOS transistor 14 and the gate and drain of the NMOS transistor 16.

As for the NMOS transistor 19, a drain is connected to the output terminal and the drain of the PMOS transistor 18, a source of the NMOS transistor 19 is connected to ground, and a gate of the NMOS transistor 19 is connected to the drain of the PMOS transistor 15 and the drain of the NMOS transistor 17.

The second comparator 4 has a similar configuration to that of the first comparator 3 described above, of which a further description is omitted for brevity.

In the hysteresis comparator circuit 1, the first input signal Vina is input to the non-inverting input terminal Vinp of the comparator 3 as well as to the inverting input terminal Vinm of the comparator 4. The second input signal Vinb is input to the inverting input terminal Vinm of the comparator 3 as well as to the non-input terminal Vinp of the comparator 4. The comparator 3 outputs a first output signal Voutr to the R-input terminal of the RS-latch 5, and the comparator 4 outputs an output signal Vouts to the S-input terminal of the RS-latch 5. The RS-latch 5 outputs a hysteresis output signal Voutq at the Q-output terminal, which is inverted in response to the incoming R- and S-input signals Voutr and Voutq.

As for the source potential of the PMOS transistors 14 and 15 that form the differential pair 30 in the comparators 3 and 4, the resistor 23 provided at the source side of the PMOS transistor 14 generates a voltage difference between the source voltage of the PMOS transistor 14 and the source voltage of the PMOS transistor 15. As a result, it is possible to provide a hysteresis voltage by a voltage drop generated at the resistor 23 with respect to the input signal to the input terminal Vinp that is connected to the gate of the PMOS transistor 14.

For example, assume that the voltage drop at the resistor 23 is 100 mv. In this case, the comparators 3 and 4 invert the logic of the output signal when a relation between the gate signals for the gate of the PMOS transistors 14 and 15 becomes Vinp−Vinm=100 (mv), i.e., Vinp=Vinm+100 (mv) or Vinm=Vinp−100 (mv).

By accurately maintaining a fixed ratio of a resistance of the load resistor 22 to a resistance of the differential resistor 23, it is possible to minimize a variation in the voltage drop through the resistor 23, i.e., the difference between a voltage at the drain of the PMOS transistor 13 and a voltage at the source of the PMOS transistor 14, even if the current supplied to the comparators 3 and 4 varies from an intended value.

It is now explained how the accuracy of resistance ratio determines the hysteresis characteristic of the hysteresis comparator circuit 1.

When a current flowing through the resistor 23 is Icomp and the resistance of the resistor 23 is R1, a voltage drop Vo across the resistor 23 is expressed by the following formula (1):

$$Vo = R1 * I\text{comp} \qquad (1)$$

When the resistance of the resistor 22 is R2 and the resistance ratio is R1:R2=β:α, the resistance R2 of the resistor 22 is expressed by the following formula (2):

$$R2 = \alpha * R1/\beta \qquad (2)$$

Further, when a voltage of the constant current source 2 is Vref and a current of the constant current source 2 is Iref, the current Iref of the constant current source 2 is expressed by the following formula (3):

$$Iref=Vref*\beta/(\alpha*R1) \qquad (3)$$

Given that the size ratio of the PMOS transistors 11 and 13 is 1:2α, the ratio Iref:Icomp is 1:α. Accordingly, the current Iref of the constant current source 2 is expressed by the following formula (4):

$$Icomp=\alpha*Iref \qquad (4)$$

Substituting the formula (3) into the formula (4) yields the following formula (5) which represents the current Icomp flowing through the resistor 23:

$$Icomp=\alpha*Vref*\beta/(\alpha*R1)=Vref*\beta/R1 \qquad (5)$$

Further, substituting the formula (5) into the formula (1) yields the following formula (6) which represents the voltage drop Vo through the resistor 23:

$$Vo=R1*(Vref*\beta/R1)=Vref*\beta \qquad (6)$$

According to the formula (6), the amount of hysteresis is determined by the voltage of the constant current source 2 Vref and the parameter β.

With the Vref held constant, the hysteresis amount depends solely on the parameter β. Accordingly, if the parameter β is accurately kept at a fixed value, the hysteresis comparator circuit 1 can maintain consistent hysteresis characteristics. Further, where the parameter β can be changed freely, it is possible to provide the hysteresis comparator circuit 1 with a wide range of hysteresis characteristics.

To obtain high precision of the hysteresis comparator circuit 1, it is possible to cancel variations in the resistors 22 and 23 by arranging the resistors 22 and 23 close to each other in a common-centroid layout, where the hysteresis comparator circuit 1 is integrated into an integrated circuit (IC).

Figure 3:
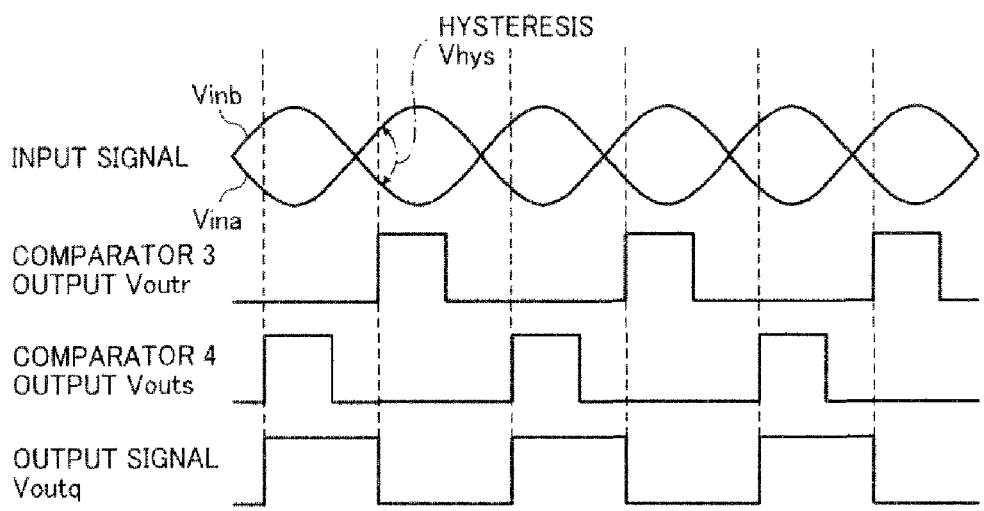
FIG. 3 is a timing chart illustrating operation of the hysteresis comparator circuit of FIG. 1.

Referring to a timing chart of FIG. 3, operation of the hysteresis comparator circuit 1 is now described. In the timing chart of FIG. 3, the input signals Vina and Vinb are represented by symmetrical, positive and negative sign waves for ready understanding and explanation.

During operation, the first and second input signals Vina and Vinb are input to the first and second comparators 3 and 4, respectively. Further, as described previously, when the difference between the input signals Vina and Vinb reaches the given hysteresis width Vhys, the comparators 3 and 4 invert the output Voutr of the RS logic circuit 5. More specifically, the comparator 3 changes the output logic when Vina−Vinb=Vhys, while the comparator 4 changes the output logic when Vinb−Vina=Vhys.

The hysteresis comparator circuit 1 is designed to provide an output with a hysteresis or delay after a zero-crossing of the input signals, as in the case with most hysteresis comparators. Such a hysteresis output is obtained by inputting the output signals of the comparator 3 and 4 to the two input terminals of the RS latch 5, which in turn outputs an output signal Voutq that goes high and low as each of the signals input from the comparators 3 and 4 transitions.

Hence, the hysteresis comparator circuit 1 that compares first and second input signals Vina and Vinb includes a constant current source 2 including a load resistor 22 to generate a constant current, a first comparator 3 supplied with the constant current and including a first differential pair 30 and a first differential resistor 23 provided at one half of the differential pair 30 to generate a first comparison result Voutr, a second comparator 4 supplied with the constant current and including a second differential pair 30 and a second differential resistor 23 provided at one half of the differential pair 30 to generate a second comparison result Vouts, and an output circuit 5 which inverts its output in response to each of the first and second comparison results Voutr and Vouts to generate a hysteresis output signal Voutq.

With the ratio of the resistance of the resistor 23 to the resistance of the load resistor 22 being kept at a fixed value, the hysteresis comparator circuit 1 provides a desired voltage drop across the differential resistor 23, which allows for precise hysteresis characteristics of the hysteresis comparator circuit 1.

Moreover, the hysteresis comparator circuit 1 obtains a hysteresis output through the first and second comparators 3 and 4 in combination with the RS latch 5, wherein the RS latch 5 inverts its output in response to the first comparison results of the first and second comparators 3 and 4, the former with the positive and negative inputs connected to the first and second input signals Vina and Vinb, respectively, to invert the output signal Voutr when the difference Vina-Vinb reaches the hysteresis width Vhys, and the latter with the positive and negative inputs connected to the second and first input signals Vinb and Vina, respectively, to invert the output signal Vouts when the difference Vinb-Vina reaches the hysteresis width Vhys. This allows for a simple configuration of the hysteresis comparator circuit 1 to provide a wide range of precise hysteresis characteristics without requiring a switch or a feedback circuit for adjusting the hysteresis output.

Figure 4:
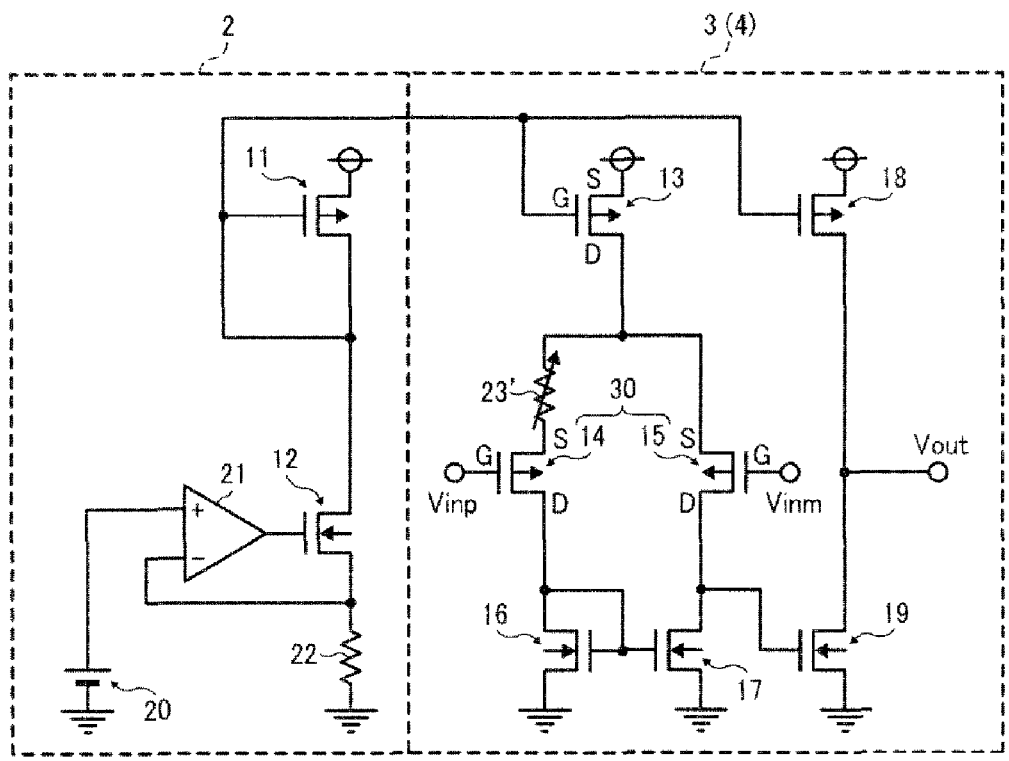
FIG. 4 is a circuit diagram of a hysteresis comparator according to another illustrative embodiment of this patent specification.

In the embodiment described above, the differential resistor 23 is configured to exhibit a fixed resistance. In a further embodiment, a variable, differential resistor 23' whose resistance can be externally specified may be used in place of the fixed resistor, as shown in FIG. 4. This arrangement allows for occasional adjustment of the hysteresis amount established through the comparator, leading to increased performance of the precise, wide-range hysteresis comparator circuit 1.

Although in the several embodiments described in this patent specification the output circuit 5 is configured as an RS latch, any circuit that can provide a similar function, i.e., inverting its output in response to the output signals of the comparator 3 and 4, may be employed instead of an RS latch.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2009-206591 filed on Sep. 8, 2009 in the Japanese Patent Office, the entire contents of which are incorporated by reference herein.

What is claimed is:

1. A hysteresis comparator circuit that compares first and second input signals to output a hysteresis output signal, the hysteresis comparator circuit comprising:

a constant current source including a load resistor to generate a given constant current;

a first comparator controlled by the constant current supplied from the constant current source to compare the first and second input signals to output a first comparison result, the first comparator including:

a first differential pair to receive the first input signal at a positive input terminal thereof and the second input signal at a negative input terminal thereof; and a first differential resistor provided at one of the differential pair to exhibit a resistance maintained at a fixed ratio to a resistance value of the load resistor;

a second comparator controlled by the constant current supplied from the constant current source to compare the first and second input signals to output a second comparison result, the second comparator including:
- a second differential pair to receive the first input signal at a negative input terminal thereof and the second input signal at a positive input terminal thereof; and
- a second differential resistor provided at one of the differential pair to exhibit a resistance maintained at a fixed ratio to the resistance value of the load resistor; and an output circuit having a pair of inputs thereof connected to the first and second comparators, respectively, which inverts an output thereof in response to each of the first and second comparison results to generate the hysteresis output signal, wherein the constant current source supplies the constant current to both the first comparator and the second comparator, and wherein a ratio between the constant current generated by the constant current source and a first current flowing through the first differential resistor of the first comparator, as well as a ratio between the constant current and a second current flowing through the second differential resistor of the second comparator, is dependent on the resistance value of the load resistor of the constant current source.

2. The hysteresis comparator circuit according to claim 1, wherein at least one of the first and second differential resistors is a variable resistor having a resistance that is adjustable externally.

3. A semiconductor device that incorporates the hysteresis comparator circuit of claim 1, wherein the load resistor and the differential resistor are disposed close to each other.

4. The semiconductor device according to claim 3, wherein the load resistor and the differential resistor are arranged in a common-centroid configuration.

5. The hysteresis comparator circuit according to claim 1, wherein
- one end of the first differential resistor is connected to one of the first differential pair and another end of the first differential resistor is connected to another of the first differential pair, and
- one end of the second differential resistor is connected to one of the second differential pair and another end of the second differential resistor is connected to another of the second differential pair.

6. A hysteresis comparator circuit that compares first and second input signals to output a hysteresis output signal, the hysteresis comparator circuit comprising:

- a constant current source including a transistor and a load resistor to generate a given constant current;
- a first comparator controlled by the constant current supplied from the constant current source to compare the first and second input signals to output a first comparison result, the first comparator including:
  - a first differential pair to receive the first input signal at a positive input terminal thereof and the second input signal at a negative input terminal thereof; and
  - a first differential resistor provided at one of the differential pair to exhibit a resistance value maintained at a fixed ratio to a resistance value of the load resistor;
- a second comparator controlled by the constant current supplied from the constant current source to compare the first and second input signals to output a second comparison result, the second comparator including:
  - a second differential pair to receive the first input signal at a negative input terminal thereof and the second input signal at a positive input terminal thereof; and
  - a second differential resistor provided at one of the differential pair to exhibit a resistance value maintained at a fixed ratio to the resistance value of the load resistor; and
- an output circuit having a pair of inputs hereof connected to the first and second comparators, respectively, which inverts an output thereof in response to each of the first and second comparison results to generate the hysteresis output signal, wherein the constant current source supplies the constant current to both the first comparator and the second comparator, and wherein for each comparator of the first and second comparators, the comparator further includes a transistor, and a site ratio between the transistor included in the constant current source and the transistor included in the comparator is dependent on a ratio between the resistance value of the load resistor of the constant current source and a resistance value of the differential resistor of the comparator.

7. The hysteresis comparator circuit according to claim 6, wherein at least one of the first and second differential resistors is a variable resistor having a resistance that is adjustable externally.

8. A semiconductor device that incorporates the hysteresis comparator circuit of claim 6, wherein the load resistor and the differential resistor are disposed close to each other.

9. The semiconductor device according to claim 8, wherein the load resistor and the differential resistor are arranged in a common-centroid configuration.

* * * * *